United States Patent
Weyers et al.

(10) Patent No.: US 8,003,996 B2
(45) Date of Patent: Aug. 23, 2011

(54) LIGHT-EMITTING SEMICONDUCTOR COMPONENT COMPRISING ELECTROLUMINESCENT AND PHOTOLUMINESCENT LAYERS AND ASSOCIATED METHOD OF PRODUCTION

(75) Inventors: Markus Weyers, Wildau (DE); Martin Zorn, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 147 days.

(21) Appl. No.: 12/517,069

(22) PCT Filed: Dec. 12, 2007

(86) PCT No.: PCT/EP2007/011077
§ 371 (c)(1),
(2), (4) Date: May 31, 2009

(87) PCT Pub. No.: WO2008/071452
PCT Pub. Date: Jun. 19, 2008

(65) Prior Publication Data
US 2010/0025712 A1    Feb. 4, 2010

(30) Foreign Application Priority Data
Dec. 12, 2006  (DE) .......................... 10 2006 059 612

(51) Int. Cl.
*H01L 27/15*   (2006.01)
*H01L 29/26*   (2006.01)
*H01L 31/12*   (2006.01)
*H01L 33/00*   (2006.01)

(52) U.S. Cl. .................. 257/80; 257/98; 257/E33.067; 438/24; 438/29

(58) Field of Classification Search .............. None
See application file for complete search history.

(56) References Cited

U.S. PATENT DOCUMENTS
5,793,062 A * 8/1998 Kish et al. .................. 257/98
(Continued)

FOREIGN PATENT DOCUMENTS
DE    102004052245 A1    2/2006
(Continued)

OTHER PUBLICATIONS
Brunner et al, "Continuous-Wave Dual-Wavelength Lasing in a Two-Section Vertical-Cavity Laser", IEEE Photonics Tech. Letters, vol. 72 No. 10, pp. 1316-1318, Oct. 10, 2000.*
(Continued)

*Primary Examiner* — Evan Pert
*Assistant Examiner* — Andres Muñoz
(74) *Attorney, Agent, or Firm* — Perkins Coie LLP

(57) ABSTRACT

The present invention relates to a semiconductor component and an associated production method, said component emitting at least two defined wavelengths with a defined intensity ratio. It is an object of the present invention to specify an optical semiconductor component and an associated production method, said component emitting at least two defined wavelengths with a defined intensity ratio. In this case, the intention is that both the wavelengths and the intensity ratio can be set extremely precisely. The semiconductor component according to the invention has a substrate (8), a first charge carrier barrier layer (7) arranged on the substrate (8), a photoluminescent layer (6) arranged on the first charge carrier barrier layer (7), a second charge carrier barrier layer (5) arranged on the photoluminescent layer (6), and an active electroluminescent layer (4) composed of at least one inorganic semiconductor and arranged on the second charge carrier barrier layer (5), wherein the photoluminescent layer (6) absorbs at least part of the light emitted by the electroluminescent layer (4), and an at least partly transparent contact layer (1) arranged on the active electroluminescent layer (4) is furthermore provided.

14 Claims, 1 Drawing Sheet

U.S. PATENT DOCUMENTS

| | | | |
|---|---|---|---|
| 7,202,506 B1 * | 4/2007 | DenBaars et al. | 257/90 |
| 7,283,577 B2 * | 10/2007 | Schmid et al. | 372/99 |
| 7,884,383 B2 * | 2/2011 | Wirth | 257/98 |
| 2002/0139984 A1 | 10/2002 | Sugawara et al. | |
| 2003/0006430 A1 | 1/2003 | Shibata et al. | |
| 2006/0054905 A1 * | 3/2006 | Schwach et al. | 257/89 |
| 2006/0192211 A1 * | 8/2006 | Kako et al. | 257/79 |
| 2009/0001389 A1 * | 1/2009 | Wang et al. | 257/89 |

FOREIGN PATENT DOCUMENTS

| | | |
|---|---|---|
| EP | 0486052 A1 | 5/1992 |
| WO | 02097902 A1 | 12/2002 |

OTHER PUBLICATIONS

Diagne et al., "Vertical cavity violet light emitting diode incorporating an aluminum gallium nitride distributed Bragg mirror and a tunnel junction", Applied Physics Letters, vol. 79 No. 22, pp. 3720-3722, Nov. 26, 2001.*

* cited by examiner

LIGHT-EMITTING SEMICONDUCTOR COMPONENT COMPRISING ELECTROLUMINESCENT AND PHOTOLUMINESCENT LAYERS AND ASSOCIATED METHOD OF PRODUCTION

FIELD OF THE INVENTION

The present invention relates to a semiconductor component and a method for manufacturing same and, in particular to a semiconductor component (as well as a method for manufacturing same) which emits at least two defined wavelengths with a defined intensity ratio.

BACKGROUND

In the method of optical parameters (e.g., absorption), there is the problem that the measured variable cannot readily be determined as an absolute number. It is therefore often necessary to use a second optical signal (reference radiation) of a different wavelength for standardization in addition to the electromagnetic radiation (signal radiation) used for the actual measurement. It is especially desirable for these (two) signals to have a precisely defined intensity ratio.

In the prior art it is known that the two signals may be generated by two individual separate semiconductor components (e.g., by two laser diodes). However, there is the problem here that the two signals must be combined by complex optical systems.

SUMMARY

The object of the present invention is therefore to provide a compact and inexpensively manufacturable optical semiconductor component as well as a method for manufacturing same, which emits at least two defined wavelengths with a defined intensity ratio. The wavelengths and the intensity ratio of the signal beam and the reference beam should both be adjustable with an extremely high precision. In addition, the reference beam should have a low intensity (preferably between 0.001% and 15%, especially preferably between 0.1% and 15%) as the signal beam.

The essential advantage here is that the two (or more) luminescence signals are emitted from a single semiconductor component. Furthermore, the intensity ratio of the signals can be adjusted precisely (i.e., custom tailored) during the manufacturing process.

The idea of the present invention, in addition to providing an electroluminescent (semiconducting) layer, is to provide a photoluminescent (semiconducting) layer, such that this photoluminescent layer is preferably formed by means of an epitaxial method (especially preferably metal organic vapor phase epitaxy, molecular beam epitaxy or chemical vapor phase epitaxy) with a relatively small layer thickness (<<100 μm). The photoluminescence properties of the photoluminescent layer and thus the intensity ratio of the two signals (electroluminescent light of the electroluminescent layer and photoluminescent light of the photoluminescent layer) can therefore be adjusted with a high precision.

The wording "one layer is applied to another layer" or "one layer is arranged on another layer" as used below should be understood to mean that the one layer is arranged on the other layer, preferably directly, and/or is applied directly to the other layer, but it should also be possible for additional layers to be present between the one layer and the other layer.

According to a first embodiment variant, the inventive layer for manufacturing a semiconductor component that emits at least two defined wavelengths with a defined intensity ratio has the following method steps: providing a substrate, applying a first charge carrier barrier layer to the top side of the substrate, applying a photoluminescent layer to the charge carrier barrier layer, applying a reflective layer to the photoluminescent layer, such that the reflective layer still functions as the second charge carrier barrier layer, applying an active electroluminescent layer of at least one inorganic semiconductor to the reflective layer, such that the photoluminescent layer absorbs at least a portion of the light emitted by the electroluminescent layer, and applying an at least partially transparent contact to the active electroluminescent layer. Especially low intensity ratios (i.e., intensity of the photoluminescent light of the photoluminescent layer emitted by the component to the intensity of the electroluminescent light of the electroluminescent layer emitted by the component) can be adjusted in the range of 0.001-15% (especially preferably between 0.1% and 15%) with a very high precision in this way.

The substrate should preferably not have any photoluminescence. This may be achieved by applying a reflector (Bragg reflector) between the substrate and electroluminescent layer, such that the reflector which is effective for the electroluminescent layer. This reflector reduces the excitation of photoluminescence by the electroluminescent light.

In an alternative preferred embodiment variant, a photoluminescent substrate (e.g., p-doped GaAs substrate) is used as the substrate, but it is not surrounded by charge carrier barriers on both sides. The emission is therefore much weaker than that in the photoluminescent layer. The same thing is similarly also true of the charge carrier barrier layer, the reflective layer, the electroluminescent layer and the contact layer.

Accordingly the inventive semiconductor component has the following: a substrate, a first charge carrier barrier layer arranged on the substrate, a photoluminescent layer arranged on the charge carrier barrier layer, a reflective layer arranged on the photoluminescent layer, such that the reflective layer also functions as the second charge carrier barrier layer, an active electroluminescent layer of at least one inorganic semiconductor arranged on the reflective layer, such that the photoluminescent layer absorbs at least a portion of the light emitted by the electroluminescent layer, and an at least partially transparent contact layer arranged on the active electroluminescent layer (the contact layer may be etched away in the emission range for the final component).

Charge carriers are preferably injected into the semiconductor component via the contact layer and via the (semiconducting) substrate (by applying an electric field), such that the electroluminescent layer is excited to an electroluminescence at a first wavelength, such that the photoluminescent layer is excited to a photoluminescence at a second wavelength by the electroluminescent light emitted by the electroluminescent layer. Alternatively, it is also possible to inject the charge carriers via the contact layer and another (second) contact layer, such that the second contact layer is preferably arranged on the top/bottom side of the substrate.

In addition to a first charge carrier barrier layer, the reflective layer is also designed as a charge carrier barrier layer. By introducing the charge carrier barrier layers which have a greater band gap than the photoluminescent layer, this achieves the result that the charge carriers generated by the light of the electroluminescent layer are and/or remain localized in the photoluminescent layer. Without these layers, the charge carriers could diffuse through the semiconductor material and be lost for the photoluminescence process, which would lead to unreproducible photoluminescence intensities, among other things. In other words, the object of the charge carrier barrier layer is to keep the charge carriers in the photoluminescent layer but not affect the remaining function of the component.

The height of the charge carrier barrier of the charge carrier barrier layer(s) is preferably 0.1-0.9 eV (more preferably 0.15-0.75 eV and even more preferably 0.4-0.75 eV). The height of the charge carrier barrier layer in the sense of the present patent application should be understood to be the sum of the conduction band and valence band discontinuities between the photoluminescent layer and the corresponding charge carrier barrier layer.

In a preferred exemplary embodiment, the photoluminescent layer comprises GaAs, the lower barrier layer (closest to the substrate) comprises $Al_{0.3}Ga_{0.7}As$ and the top barrier layer comprises alternating layers of AlAs and $Al_{0.5}Ga_{0.5}As$ (DBR reflector). The difference in the band edge (i.e., the height of the charge carrier barrier) in this case amounts to 0.24 eV (conduction band, direct)+0.17 eV (valence band)= 0.41 eV (total) for $Al_{0.3}Ga_{0.7}As$ and 0.16 eV (conduction band, indirect)+0.59 eV (valence band)=0.75 eV (total) for AlAs.

Before applying the charge carrier barrier layer, a buffer layer is preferably deposited on the top side of the substrate and the charge carrier barrier layer is subsequently applied to the buffer layer.

The photoluminescent layer preferably contacts the first charge carrier barrier layer directly (first embodiment variant) and/or the photoluminescent layer contacts the second charge carrier barrier layer directly (first and second embodiment variants). The photoluminescent layer is preferably surrounded directly by a first charge carrier barrier layer and a second charge carrier barrier.

The substrate, the first charge carrier barrier layer, the photoluminescent layer, the second charge carrier barrier layer, the electroluminescent layer and the contact layer are preferably formed by a semiconducting (inorganic) material. The buffer layer is preferably formed from the same material as the substrate (e.g., GaAs) and has a thickness between 100 nm and 500 nm. The buffer layer serves to make available a clean surface for the downstream process after deoxidation of the substrate. However, according to the present invention, this buffer layer may also be omitted without restricting the function of the component.

Only by arranging the reflective layer can especially low intensity ratios be achieved by a simple method. The reflective layer is preferably formed by a plurality of layers having alternating refractive indices (distributed Bragg reflector (DBR)).

All layers of the semiconductor component are preferably embodied as planar layers. However, the inventive component can also be manufactured on nonplanar structures.

In a preferred embodiment variant, the reflective layer is embodied with a reflectivity of more than 20% for the wavelength of the electroluminescent light emitted by the electroluminescent layer (preferably more than 80%, especially preferably more than 90%) and/or a reflectivity of less than 50% for the wavelength of the photoluminescent light emitted by the photoluminescent layer (preferably less than 30%, especially preferably less than 10%).

A predetermined intensity ratio between the total intensity of the light of the photoluminescent layer output via the second contact layer and the total intensity of the light of the electroluminescent layer output via the second contact layer is preferably adjusted through the choice of these parameters: the reflectivity of the reflective layer for the wavelength of the photoluminescent light emitted by the photoluminescent layer, the reflectivity of the reflective layer for the wavelength of the electroluminescent light emitted by the electroluminescent layer and the conversion efficiency of the photoluminescent layer in converting absorbed electroluminescent light into emitted photoluminescent light. The conversion efficiency of the photoluminescent layer is preferably adjusted through the choice of these parameters: thickness of the photoluminescent layer and absorption capacity of the photoluminescent layer for light of the wavelength of the electroluminescent light emitted by the electroluminescent layer.

Absorption capacity in the sense of the present patent application is understood to be the product of the absorption coefficient and the layer thickness.

The half-width of the emissions of the electroluminescent layer and the photoluminescent layer is preferably in the range of 10 nm to 100 nm.

The defined intensity ratio is preferably between 0.2 and 0.001, more preferably between 0.03 and 0.005.

The substrate, the first charge carrier barrier layer, the photoluminescent layer, the second charge carrier barrier layer, the electroluminescent layer and the contact layer are preferably formed by an inorganic semiconducting material. The photoluminescent layer is preferably embodied with an absorption capacity of more than 0.6 for light of the wavelength of the electroluminescent light emitted by the electroluminescent layer (more preferably 0.8, and even more preferably 0.9). The absorption coefficient $\alpha$ is preferably between $8\ cm^{-1}$ and $50{,}000\ cm^{-1}$ (more preferably between $5{,}000\ cm^{-1}$ and $50{,}000\ cm^{-1}$).

The photoluminescent layer is preferably embedded in a layer that absorbs electroluminescent light of the wavelength emitted by the electroluminescent layer and whose band gap is greater than the band gap of the photoluminescent layer, so that the charge carriers generated in absorption will relax into the photoluminescent layer, where they then recombine, emitting light.

Even more preferably, the photoluminescent layer comprises various layers that function as internal barriers and internal photoluminescent layers, such that the electroluminescent light emitted by the electroluminescent layer is absorbed (preferably at least 80%) and the band gap of the internal barrier is greater than the band gap of the internal photoluminescent layer, so that the charge carriers relax into the internal photoluminescent layer, where they then recombine, emitting light.

The photoluminescent layer is preferably formed by means of an epitaxial method. The photoluminescent layer is preferably formed by means of metal organic vapor phase epitaxy (MOVPE), molecular beam epitaxy (MBE) or chemical vapor phase epitaxy (CVD). It is thus possible in particular to adjust the photoluminescence properties of the photoluminescent layer (and therefore the intensity ratio) with a high precision.

The photoluminescent layer is preferably embodied with a layer thickness of more than 10 mm (more preferably more than 20 nm and even more preferably more than 30 nm) and with a layer thickness of less than 100 μm (more preferably less than 20 μm).

The substrate, the first charge carrier barrier layer, the photoluminescent layer and the second charge carrier barrier layer are preferably embodied as p-conducting layers, and the contact layer is embodied as an n-conducting layer. The photoluminescent layer is preferably formed from gallium arsenide. The photoluminescent layer is preferably formed from p-doped gallium arsenide. The doping preferably amounts to between $1 \cdot 10^{17}\ cm^{-3}$ and $1 \cdot 10^{19}\ cm^{-3}$.

Alternatively, the substrate, the first charge carrier barrier layer, the photoluminescent layer and the second charge carrier barrier layer may be designed as n-conducting layers and the contact layer as a p-conducting layer. In this embodiment, the photoluminescent layer is preferably formed from gallium arsenide. The photoluminescent layer is preferably formed from n-doped gallium arsenide. The doping preferably amounts to between $1\cdot10^{17}$ cm$^{-3}$ and $1\cdot10^{19}$ cm$^{-1}$.

The first charge carrier barrier layer is preferably applied directly to the top side of the substrate, the photoluminescent layer 6 is applied directly to the first charge carrier barrier layer, the second charge carrier barrier layer is applied directly to the photoluminescent layer and the electroluminescent layer is applied directly to the second charge carrier barrier layer (in the preferred exemplary embodiment of the invention, the electroluminescent layer comprises several layers, namely quantum troughs and surrounding barriers, namely 10 InGaP quantum troughs in AlInGaP barriers; however, this is not obligatory; the electroluminescent layer may also comprise a single layer).

The electroluminescent layer is preferably formed with an emission wavelength in the range between 400 nm and 900 nm (600 nm and 700 nm and/or 625 nm and 675 nm). The first charge carrier barrier layer is preferably formed by AlGaAs with a thickness between 10 nm and 5 µm.

In an especially preferred embodiment variant of the invention, the semiconductor component comprises at least two photoluminescent layers, each photoluminescent layer being arranged between the substrate and the contact layer and the at least two photoluminescent layers emitting at different wavelengths. The aforementioned preferred embodiments of the photoluminescent layer are also considered similarly for the at least two photoluminescent layers. It is therefore possible to provide a semiconductor component that emits at least three wavelengths.

Before applying the first charge carrier barrier layer, a second contact layer of an inorganic semiconducting material is preferably applied to the top side of the substrate. Alternatively, it is preferable for a second contact layer of an inorganic semiconducting material or a metal to be applied to the bottom side of the substrate.

The first charge carrier barrier layer, the photoluminescent layer, the second charge carrier barrier layer (reflective layer), the electroluminescent layer and the contact layer are preferably applied one after the other by metal organic vapor phase epitaxy (MOVPE) in one continuous manufacturing operation.

Before applying the contact layer, a current spreading layer is preferably applied to the electroluminescent layer. An etch stop layer is preferably applied to the current spreading layer. The contact layer is preferably structured, forming no contact layer in areas where light is to be output.

The first charge carrier barrier layer is preferably formed by AlGaAs. The first charge carrier barrier layer is preferably formed with a thickness between 10 nm and 5 µm. The reflective layer is preferably formed as a DBR layer with a thickness of 1 µm to 50 µm.

The active electroluminescent layer is preferably formed with a thickness between 5 nm and 1000 nm. The active electroluminescent layer is preferably formed by indium gallium phosphide (InGaP) or aluminum indium gallium phosphide (AlInGaP).

BRIEF DESCRIPTION OF THE DRAWINGS

The invention will now be explained in greater detail below on the basis of an exemplary embodiment, which is illustrated in greater detail in the FIGURE, in which.

DETAILED DESCRIPTION

Figure 1:
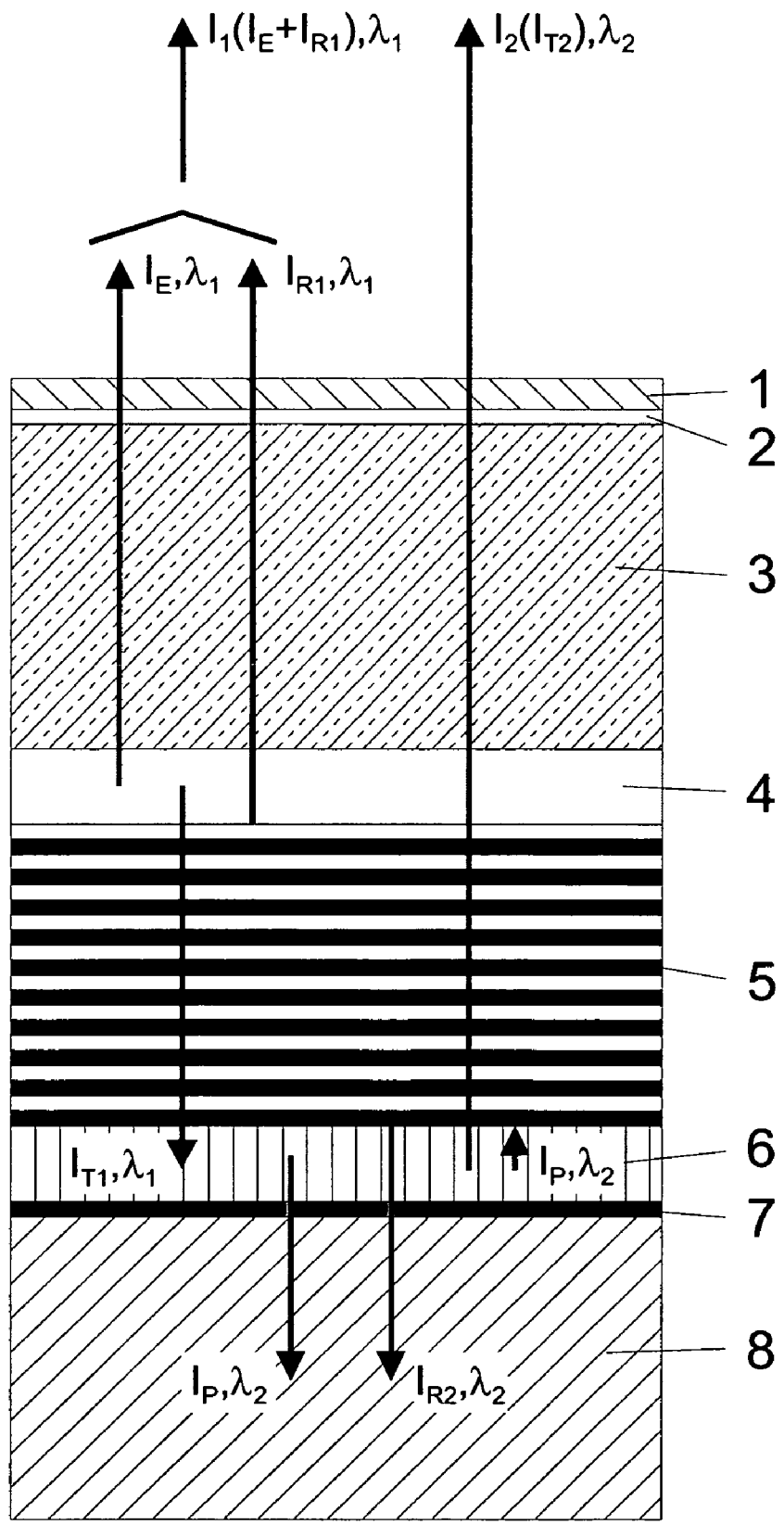
FIG. 1 shows an inventive semiconductor component in a schematic sectional diagram.

FIG. 1 shows an inventive semiconductor element in a schematic sectional diagram according to a first embodiment variant. In the present exemplary embodiment, this is a GaAs-based light-emitting diode (LED). This LED (semiconductor component) comprises an active area 4, which emits red light at a wavelength of $\lambda_1=650$ nm with a high intensity. Charge carriers are injected into the electroluminescent layer 4 first via the contact layer 1, the (optional) etch stop layer 2 and the (optional) current spreading layer 3 and secondly via the substrate 8. The light (of intensity $I_E$) emitted by the electroluminescent layer 4 has a higher photon energy above the band gap of the GaAs substrate 8 and is absorbed there. The substrate is therefore then excited to emit at $\lambda_2=870$ nm. The emission by the substrate thus occurs in addition to the original emission of the active range. The object of the present invention is now to establish a precisely defined intensity ratio of this additional emission at $\lambda_2=870$ nm to the light emission at $\lambda_1=650$ nm. This is achieved, firstly, by allowing only a defined portion of the light of the red light-emitting range to pass through a reflective layer 5 (Bragg reflector package DBR: distributed Bragg reflector) situated between the light-emitting area 4 and the substrate 8, allowing only a defined portion to pass through to the substrate 8. The light-emitted by the electroluminescent layer 4 is emitted upward with the intensity $I_E$ while on the other hand also being reflected on the layer 5 (intensity $I_{R1}$) and also being emitted upward (i.e., output). The portion transmitted to the photoluminescent layer 6 has the intensity $I_{T1}$.

One problem in adjusting the intensity of the emission from the GaAs substrate 8 is that it is determined to a great extent by its doping level. The semiconductor wafers normally used are manufactured from a long single crystal. However, a constant doping level cannot be ensured with the required accuracy during the manufacturing process of this single crystal. The end of the crystal normally therefore has a higher doping level than the beginning. Thus the ratio of the intensities at the output wavelength of $\lambda_1=650$ nm to the emission excited in the substrate 8 at $\lambda_2=870$ nm therefore depends on the substrate 8 used.

The idea of the present invention is introduce a separate photoluminescent GaAs layer 6 having a defined thickness and doping level between the substrate 8 and the Bragg reflector package 5. This is then separated from the substrate 8 by a charge carrier barrier layer 7 (AlGaAs here). By controlling the parameters of thickness, doping and positioning of this optically pumped photoluminescent layer 6, it is possible to accurately adjust, i.e., control the intensity $I_P$ of the emission of this layer 6 and thus also the portion $I_{T2}$ output upward.

In the exemplary structure used here, the intensity $I_{T2}=I_2$ of the emission at $\lambda_2=870$ nm amounts to only 1% of the intensity $I_1=I_E+I_{R1}$ of the light emission at $\lambda_1=650$ nm. This emission may then be used as the intensity reference, for example.

LIST OF REFERENCE NOTATION

1 Contact layer
2 Etch stop layer
3 Current spreading layer
4 Active electroluminescent area
5 Second charge carrier barrier layer/reflective layer/DBR reflector
6 Photoluminescent layer 7 First charge carrier barrier layer
8 Substrate
$\lambda_1$ Wavelength of the light emitted by the electroluminescent layer
$\lambda_2$ Wavelength of the light emitted by the photoluminescent layer
$I_E$ Intensity of the light emitted directly by the electroluminescent layer in the direction of the contact layer
$I_{R1}$ Intensity of the light of the electroluminescent layer reflected on the reflective layer
$I_{T1}$ Intensity of the light of the electroluminescent layer transmitted through the reflective layer
$I_1$ Total intensity of the light of the electroluminescent layer output through the contact layer
$I_P$ Intensity of the light emitted directly by the photoluminescent layer
$I_{R2}$ Intensity of the light of the photoluminescent layer reflected on the reflective layer
$I_{T2}$ Intensity of the light of the photoluminescent layer transmitted through the reflective layer
$I_2$ Total intensity of the light of the photoluminescent layer output through the contact layer

The invention claimed is:
1. A method for manufacturing a semiconductor component emitting two different wavelengths ($\lambda_1$, $\lambda_2$), having a defined intensity ratio ($I_2/I_1$), comprising:
providing a substrate (8),
applying a first charge carrier barrier layer (7) to the top side of the substrate (8),
applying a photoluminescent layer (6) to the first charge carrier barrier layer (7),
applying a reflective layer (5) to the photoluminescent layer (6), such that the reflective layer (5) is also designed as a second charge carrier barrier layer (5),
applying an active electroluminescent layer (4) of at least one inorganic semiconductor to the reflective layer (5), such that the photoluminescent layer (6) absorbs at least a portion of the light emitted by the active electroluminescent layer (4), and
applying an at least partially transparent contact layer (1) to the active electroluminescent layer (4),
such that the substrate (8), the first charge carrier barrier layer (7), the photoluminescent layer (6), the reflective layer (5), the active electroluminescent layer (4) and the at least partially transparent contact layer (1) are each formed by a semiconducting material,
wherein
the reflective layer (5) is designed with a reflectivity of more than 80% for the wavelength ($\lambda_1$) of the electroluminescent light emitted by the active electroluminescent layer (4).
2. The method according to claim 1,
wherein
the photoluminescent layer (6) is formed by an epitaxial method.
3. The method according to claim 1,
wherein
the photoluminescent layer (6) is formed by metal organic vapor phase epitaxy (MOVPE), molecular beam epitaxy (MBE) or chemical vapor phase epitaxy (CVD).
4. The method according to claim 1,
wherein
the photoluminescent layer (6) is formed with a layer thickness between 10 nm and 20 μm.

5. The method according to claim 1,
wherein
the photoluminescent layer (6) is formed from p-doped gallium arsenide, with the doping being between $1.10^{17}$ cm$^{-3}$ and $1.10^{19}$ cm$^{-3}$, or the photoluminescent layer (6) is formed from n-doped gallium arsenide, with the doping being between $1.10^{17}$ cm$^{-3}$ and $1.10^{19}$ cm$^{-3}$.
6. The method according to claim 1,
wherein
the reflective layer (5) is formed with a reflectivity of less than 30% for the wavelength ($\lambda_2$) of the photoluminescent light emitted by the photoluminescent layer (6) and a reflectivity of more than 90% for the wavelength ($\lambda_1$) of the electroluminescent light emitted by the active electroluminescent layer (4).
7. The method according to claim 1,
wherein
the photoluminescent layer (6) is formed with an absorption capacity of more than 0.6 for light of the wavelength ($\lambda_1$) of the electroluminescent light emitted by the active electroluminescent layer (4), wherein the absorption capacity is the product of the absorption coefficient and the layer thickness of the photoluminescent layer (6).
8. A semiconductor component, comprising
a substrate (8),
a first charge carrier barrier layer (7) arranged on the substrate (8),
a photoluminescent layer (6) arranged on the first charge carrier barrier layer (7),
a reflective layer (5) arranged on the photoluminescent layer (6), such that the reflective layer (5) is also formed as a second charge carrier barrier layer (5),
an active electroluminescent layer (4) arranged on the reflective layer (5), comprising at least one inorganic semiconductor, such that the photoluminescent layer (6) absorbs at least a portion of the light emitted by the active electroluminescent layer (4), and
an at least partially transparent contact layer (1) arranged on the active electroluminescent layer (4),
such that the substrate (8), the first charge carrier barrier layer (7), the photoluminescent layer (6), the reflective layer (5), the active electroluminescent layer (4) and the at least partially transparent contact layer (1) are formed by a semiconducting material,
wherein
the reflective layer (5) has a reflectivity of more than 80% for the wavelength ($\lambda_1$) of the electroluminescent light emitted by the active electroluminescent layer (4).
9. The semiconductor component according to claim 8,
wherein
the photoluminescent layer (6) directly contacts the first charge carrier barrier layer (7) and/or the photoluminescent layer (6) directly contacts the reflective layer (5).
10. The semiconductor component according to claim 8,
wherein
the reflective layer (5) is formed by a Distributed Bragg Reflector (DBR) reflector.
11. The semiconductor component according to claim 8,
wherein
the photoluminescent layer (6) has an absorption capacity of more than 0.6 for light of the wavelength ($\lambda_1$) of the electroluminescent light emitted by the active electroluminescent layer (4), wherein the absorption capacity is the product of the absorption coefficient and the layer thickness of the photoluminescent layer (6).

12. The semiconductor component according to claim 8, wherein
the photoluminescent layer (6) has a layer thickness between 10 nm and 20 μm.

13. The semiconductor component according to claim 8, wherein
the active electroluminescent layer (4) has an emission wavelength ($\lambda_1$) in the range between 600 nm and 700 nm.

14. The semiconductor component according to claim 8, wherein
the first charge carrier barrier layer (7) is formed by AlGaAs and has a thickness between 10 nm and 5 μm.

* * * * *